United States Patent
Grottenthaler et al.

(10) Patent No.: US 12,289,854 B2
(45) Date of Patent: Apr. 29, 2025

(54) ELECTRONIC ASSEMBLY COMPRISING AT LEAST ONE CIRCUIT BOARD AND EXTERNAL ELECTRONIC COMPONENTS, AND INVERTER COMPRISING SUCH AN ELECTRONIC ASSEMBLY

(71) Applicant: Fronius International GmbH, Pettenbach (AT)

(72) Inventors: Patrick Grottenthaler, Pettenbach (AT); Alexander Schnetzer, Pettenbach (AT); Harald Edlinger, Pettenbach (AT); Manfred Wiesinger, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 18/686,931

(22) PCT Filed: Apr. 26, 2023

(86) PCT No.: PCT/EP2023/060878
§ 371 (c)(1),
(2) Date: Feb. 27, 2024

(87) PCT Pub. No.: WO2023/208977
PCT Pub. Date: Nov. 2, 2023

(65) Prior Publication Data
US 2024/0373577 A1    Nov. 7, 2024

(30) Foreign Application Priority Data
Apr. 27, 2022 (EP) ..................................... 22170266

(51) Int. Cl.
*H05K 7/00* (2006.01)
*H05K 1/18* (2006.01)
(Continued)

(52) U.S. Cl.
CPC ........... *H05K 7/1432* (2013.01); *H05K 1/182* (2013.01); *H05K 7/1407* (2013.01); *H05K 7/2089* (2013.01); *H05K 2201/10189* (2013.01)

(58) Field of Classification Search
CPC .... H05K 7/1432; H05K 1/182; H05K 7/1407; H05K 7/2089; H05K 2201/10189
See application file for complete search history.

(56) References Cited

U.S. PATENT DOCUMENTS 4,089,575 A    5/1978   Grabbe
9,166,310 B2   10/2015  Ludwig
(Continued)

FOREIGN PATENT DOCUMENTS

DE    10 2008 004 882 A1    7/2009
EP        3 576 280 A1    12/2019
(Continued)

OTHER PUBLICATIONS

DE 102020104106 A1 ; published on Aug. 19, 2021; English Translation (Year: 2021).*
(Continued)

*Primary Examiner* — Pete T Lee
(74) *Attorney, Agent, or Firm* — Collard & Roe, P.C.

(57) ABSTRACT

An electronic assembly includes at least one circuit board and external electronic components including electrical connections, wherein the circuit board has contacts for connection to the connections of the external electronic components, and the at least one circuit board and the external components are able to be attached to a housing part. Also, an inverter includes a power unit. A carrier which is mounted so as to be able to be moved is provided on the housing part, wherein the carrier has holders for receiving contact elements for connection to the connections of the external (Continued)

electronic components and for connection to the contacts on the circuit board.

15 Claims, 5 Drawing Sheets

(51) Int. Cl.
*H05K 7/14* (2006.01)
*H05K 7/20* (2006.01)

(56) References Cited

U.S. PATENT DOCUMENTS

| | | | | |
|---|---|---|---|---|
| 9,692,156 | B2 * | 6/2017 | Matsumoto | H01R 12/585 |
| 10,362,704 | B2 | 7/2019 | Hirano et al. | |
| 10,594,100 | B1 * | 3/2020 | Namihisa | H01R 12/62 |
| 2022/0060090 | A1 * | 2/2022 | Straub | H02K 5/148 |

FOREIGN PATENT DOCUMENTS

| | | | |
|---|---|---|---|
| WO | 2012/046152 A1 | 4/2012 | |
| WO | WO-2014170078 A1 * | 10/2014 | H05K 7/1432 |

OTHER PUBLICATIONS

DE 102016212258 ; published Jan. 11, 2018; English Translation (Year: 2018).*
DE 102018204714A1; published Oct. 2, 2019 English translation), (Year: 2019).*
Examination Report No. 1 for Standard Patent Application, Dated Aug. 19, 2024, issued in Australian Application No. 2023262105.
International Search Report in PCT/EP2023/060878, mailed Jun. 12, 2023.
European Search Report dated Nov. 4, 2022 in European Application No. 22170266.5, with English translation of the relevant parts.

* cited by examiner

ELECTRONIC ASSEMBLY COMPRISING AT LEAST ONE CIRCUIT BOARD AND EXTERNAL ELECTRONIC COMPONENTS, AND INVERTER COMPRISING SUCH AN ELECTRONIC ASSEMBLY

CROSS REFERENCE TO RELATED APPLICATIONS

This application is the National Stage of PCT/EP2023/060878 filed on Apr. 26, 2023, which claims priority under 35 U.S.C. § 119 of European Application No. 22170266.5 filed on Apr. 27, 2022, the disclosure of which is incorporated by reference. The international application under PCT article 21(2) was not published in English.

The invention relates to an electronic assembly comprising at least one circuit board and external electronic components comprising electrical connections, wherein the circuit board has contacts for connection to the connections of the external electronic components, and the at least one circuit board and the external components are able to be attached to a housing part.

Furthermore, the invention relates to an inverter, in particular a photovoltaic inverter with a power unit.

The invention relates in principle to general electronic assemblies which have at least one circuit board and also external electronic components which are correspondingly connected to the circuit board. The circuit board and the external components are usually arranged in a housing or attached to a housing part. The external electronic components are usually components of higher power and larger volume, which is why they are not attached or soldered directly to the circuit board. For example, larger chokes or larger capacitors, which generate more heat loss, are often deliberately placed away from the circuit board, for example in or on their own heat sink. The electrical connection between the external electronic component and corresponding contacts on the circuit board is usually made via cables, at the ends of which screw contacts are arranged, which are screwed to the contacts on the circuit board.

For example, the electronic assembly is an inverter or a part of the inverter, for example, the power unit. In such inverters, in particular photovoltaic inverters, individual assemblies, such as, for example, the AC-side power unit or the DC-side power unit with corresponding external electronic components, such as, for example, chokes, are arranged in a suitable manner in a housing. For maintenance purposes, it is advantageous to allow the electronic assemblies to be replaced as quickly and easily as possible.

Contacting external chokes with the circuit board via screw connections is correspondingly complex. Accordingly, a general maintenance or replacement of components of the inverter, for example a repair of the circuit board of the power unit, is time-consuming and costly. This is made even more difficult by the fact that components, in particular semiconductor components, which are soldered directly to the circuit board are often connected to corresponding heat sinks for cooling. Often, a heat-conducting paste is also arranged between the semiconductor components and the heat sinks for better heat conduction, which makes disassembly of the circuit board even more complex.

In addition, when screwing the contacts of external components to the circuit board, the screws can tilt, which means that loosening the screw connection is only possible with great effort.

In some cases, plug-in connections between the circuit boards and external electronic components offer advantages here. However, due to tolerances and displacements of the external electronic components relative to the circuit board, problems may again arise in establishing the connection between the circuit board and the contacts of the external electronic components.

For example, DE 10 2008 004 882 A1 describes a plug-in connection in which the positioning of the plug-in connection to the circuit board and thus the electrical connection between the contact pin and a corresponding counterpart on the circuit board is supported.

The object of the present invention is to provide an electronic assembly and an inverter of the above-mentioned type that support a quick and easy replacement of individual components. Disadvantages of the state of the art should be avoided or at least reduced.

The object according to the invention is achieved by an electronic assembly as mentioned above in which a carrier, which is mounted so as to be able to be moved, is provided on the housing part, the carrier having holders for receiving contact elements for connection to the connections of the external electronic components and for connection to the contacts on the circuit board. The core of the invention thus illustrates the carrier, which is mounted so as to be able to be moved, with holders for receiving contact elements. The contact elements arranged on the carrier are connected, on the one hand, to the connections of the external electronic components, which can be done by corresponding cable and solder connections, but also by screw connections. On the other hand, the contact elements arranged on the carrier establish the connection with corresponding contacts on the circuit board. The movable mounting of the carrier makes it easier to compensate for tolerances and to facilitate the connection of the contact elements to the circuit board. The movable mounting of the carrier in the connected state with the circuit board also facilitates the release of any components from heat sinks. By appropriately designing the carrier and the contact elements for connection to the connections of the external electronic components and for connection to the contacts on the circuit board, a replacement of individual components of the electronic assembly, such as, for example, the circuit board or external electronic components, can be facilitated and a rapid repair or a rapid replacement of the components can be supported. Due to the design of the carrier, mounted in such a way that it can be moved on the housing part, the additional manufacturing effort is very low.

Preferably, the carrier is mounted so as to be movable in one direction. Movability in one direction is usually sufficient to compensate for tolerances with respect to the housing part and the circuit board to be connected and is easy to produce.

For example, the movable mounting of the carrier in a direction relative to the housing part to which the carrier is connected can be made very easily in that the carrier has at least one elongated hole for receiving a fastening element, in particular a fastening screw, which fastening element can be connected to the housing part. The movability in one direction can be made by such an elongated hole and a suitable guide or two or more elongated holes with the same orientation of the longitudinal axes of the elongated holes.

If a latching lug or the like is arranged in at least one elongated hole, a specific preferred position for the fastening element can be defined. This preferred position can be overcome and left by overcoming the obstacle of the latching lug or the like, should this be necessary in the case of tolerances of the circuit board or the housing part with respect to the carrier.

The carrier is preferably made of plastic, for example of polyamide. As a result, particularly simple and cost-effective production is possible, and the contact elements arranged in the holders can be electrically insulated from one another. For example, the carriers together with the holders and the elongated holes or the like for receiving the fastening elements for fastening to the housing part can be produced very easily and cost-effectively by injection moulding.

If the carrier is configured as a grid, the weight and the carrier can be largely reduced and access to components, such as, for example, to the external electronic components arranged under the carrier, can be facilitated.

According to a further feature of the invention, at least one centring pin is arranged on the carrier, which can be arranged in a corresponding centring opening on the circuit board. Such centring pins can support the correct positioning of the circuit board with respect to the contact elements arranged on the carrier. Such a centring pin on the carrier can be made very easily, in particular when producing the carrier from a plastic by injection moulding. The corresponding counterpart on the circuit board in the form of a centring opening, at most a conical bore, can also be produced very easily and cost-effectively.

Preferably, the contact element is formed by a plug, which can be connected to a complementary socket on the circuit board. As a result of such a construction, the connection between the contact elements on the carrier and the circuit board can be formed and released again particularly quickly and easily and without tools. Depending on the strength of the current that will flow through the respective contact, the contacts and sockets with the appropriate cross-section must be selected in order to avoid local overheating and problems or even the destruction of the contact elements.

As an alternative to the above-mentioned plug-in connection, the contact element can also be configured as a screw connection, in that the contact element has, for example, an internal thread for receiving a screw with a corresponding external thread. As a result, the assembly and disassembly effort is somewhat increased, since the screw connection has to be tightened or loosened manually or automatically. However, in the case of higher transmitted currents and higher power classes, it may be necessary or even mandatory to use screw contacts instead of plug-in contacts.

Preferably, a heat sink is arranged on the housing part of the electronic assembly, which heat sink can be contacted with components arranged on the underside of the circuit board. In this way, components with a higher heat loss can be arranged primarily on the underside of the circuit board by appropriately designing it, where they can be automatically contacted with a suitable heat sink during assembly. The size and material of the heat sink is adjusted accordingly to the amount of heat to be dissipated.

A heat-conducting paste can be arranged between the components and the heat sink, which improves the heat conduction from the components arranged on the underside of the circuit board to the heat sink accordingly. For example, a so-called phase change material, a suitable substance that can absorb thermal energy, can also be used as a heat-conducting paste.

If the circuit board has at least one opening, access under the circuit board may be enabled at appropriate locations, for example, to loose fastening elements or access other components of the electronic assembly. A tool can also be arranged via such an opening in order to release the circuit board by lateral displacement of heat sinks by breaking a connection between components and a heat sink in the form of a hardened heat-conducting paste or the like. This also facilitates disassembly of the circuit board and thus makes it quicker to replace or repair.

The external electronic components can be formed, for example, by chokes which, due to the higher power class, are arranged away from the circuit board and are electrically connected to contacts on the circuit board by means of corresponding cable connections. Larger capacitors, transformers or power semiconductors are also conceivable as external electronic components.

For cooling, the chokes can be arranged in so-called choke shells, correspondingly designed and adapted heat sinks preferably made of aluminium or aluminium alloys. In addition to cooling the chokes, the choke shells also provide a corresponding mechanical receptacle for the chokes. If necessary, the chokes can be placed in the choke shells via heat-conducting pastes and, if necessary, additionally secured with fastening elements.

The object according to the invention is also achieved by an inverter as mentioned above, in particular a photovoltaic inverter, having a power unit, which power unit is configured as an electronic assembly having the above-mentioned features. As a result, an inverter can be made whose components, in particular the power unit, can be replaced particularly quickly and easily. This allows the inverters to be repaired more cost-effectively in the event of a failure. With regard to the other advantages, reference is made to the above description of the electronic assembly.

The present invention is further explained with reference to the appended drawings. In the drawings:

FIG. 1 schematically shows an electronic assembly comprising a circuit board and an external electronic component according to the state of the art;

FIG. 2 schematically shows an electronic assembly comprising a circuit board and an external electronic component according to the present invention;

Figure 1:
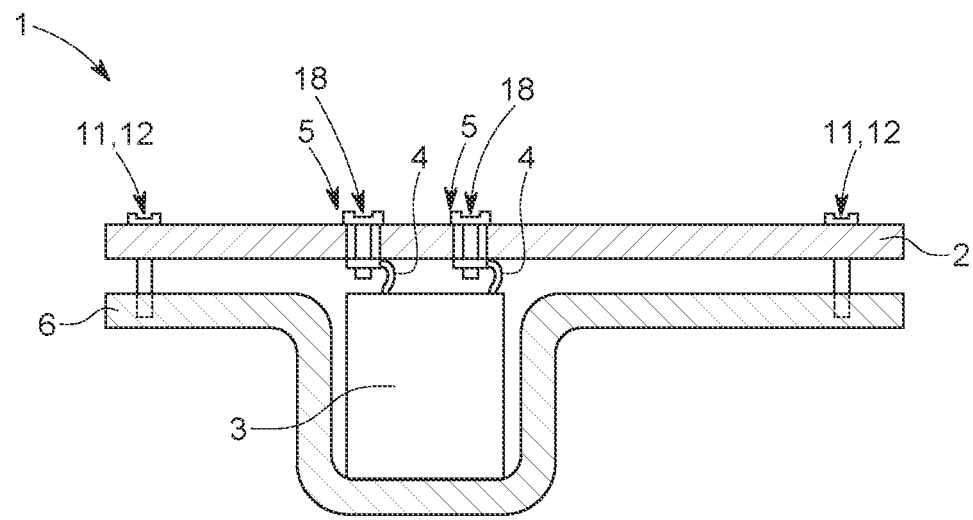

FIG. 1 schematically illustrates an electronic assembly 1 comprising a circuit board 2 and an external electronic component 3 according to the state of the art. In the sectional view illustrated, the circuit board 2, for example the power electronics of an inverter, is connected to external electronic components 3, for example corresponding chokes, via cables. The connections 4 of the external electronic components 3 are connected to the corresponding contacts 5 on the circuit board 2 via fastening screws 18. The circuit board 2 is connected, in particular screwed, to the housing part 6 via corresponding fastening elements 11, in particular fastening screws 12. The housing part 6 can simultaneously function as a receptacle for the external electronic component 3 and can also simultaneously cool this external electronic component 3 by producing the housing part 6 from metal and having cooling ribs or the like at correspondingly suitable points for dissipating the heat (not illustrated).

The establishment and release of the screw connections for the electrical connection of the connections 4 of the external electronic components 3 to the contacts 5 on the circuit board 2 with the fastening screws 18 is relatively complex and can often only be carried out manually. Particularly in the case of manufacturing tolerances, it can be particularly difficult to arrange the fastening screws 18 in the right places, which can also cause the screws to tilt, making assembly and disassembly even more difficult. As a result, the cost of repairing a defective electronic assembly 1 is relatively high.

Figure 2:
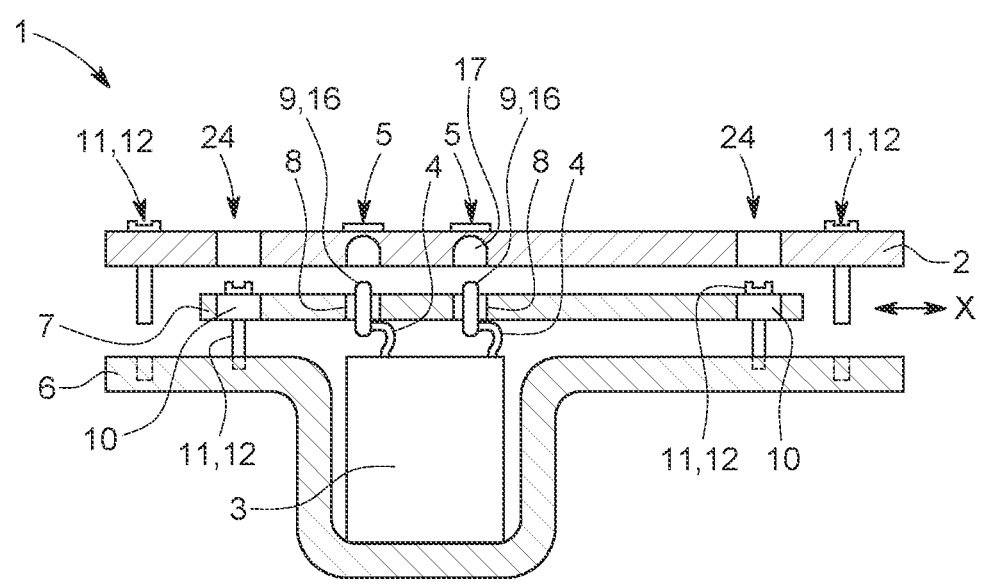

FIG. 2 schematically shows an electronic assembly 1 with a circuit board 2 and an external electronic component 3 according to the present invention. According to the invention, a carrier 7, which is mounted so as to be able to be moved, is provided on the housing part 6. The movability in at least one direction is illustrated by the horizontally arranged double arrow X next to the carrier 7. The movability of the carrier 7 relative to the housing part 6 in at least one direction can be easily made by corresponding elongated holes 10 (see also FIGS. 3 and 4), in which elongated holes 10 suitable fastening elements 11, in particular fastening screws 12, are arranged for fastening to the housing part 6. Holders 8 for receiving contact elements 9 are provided on the carrier 7. The contact elements 9 arranged in the holders 8 of the carrier 7 are connected in a suitable manner to the connections 4 of the external electronic components 3, for example chokes. Furthermore, the contact elements 9 are formed in the holders 8 of the carrier 7 for connection to the contacts 5 on the circuit board 2. In the exemplary embodiment illustrated, the contact elements 9 are configured as plugs 16 and the contacts 5 on the circuit board 2 are provided with correspondingly matching sockets 17. Likewise, the contact elements 9 could also have an internal thread for receiving a screw with a corresponding external thread (not illustrated).

During assembly, the carrier 7 is first connected to the external electronic component 3 by arranging the contact elements 9 in the holders 8 of the carrier 7 provided for this purpose. Thereafter, the carrier 7 is provisionally connected to the housing part 6, for example via the fastening screws 12 arranged in the elongated holes 10. A displacement in the direction of the double arrow X is still possible. Thereafter, the circuit board 2 is arranged above the carrier 7. Due to the movability of the carrier 7 and the contact elements 9 arranged thereon, certain tolerances can be compensated for and a secure connection of the contact elements 9 to the contacts 5 on the circuit board 2 can be made possible quickly. In the case of a plug-in connection made by the plugs 16 and sockets 17, the connection of the contact elements 9 or of the external electronic components 3 to the corresponding contacts 5 on the circuit board 2 can be established quickly and without tools and can also be released again. When the circuit board 2 is connected to the contact elements 9 on the carrier 7, both the carrier 7 and the circuit board 2 can be fastened to the housing part 6 via corresponding fastening elements 11, in particular fastening screws 12. If necessary, corresponding openings 24 are arranged in the circuit board 2 in order to be able to actuate the fastening elements 11, in particular fastening screws 12, which may be arranged below them, with suitable tools (not illustrated).

This results in a simpler and faster fastening and release of the circuit board 2 to and from the external electronic components 3, as a result of which repair or replacement of individual components of the electronic assembly 1 is made possible more quickly.

Figure 3:
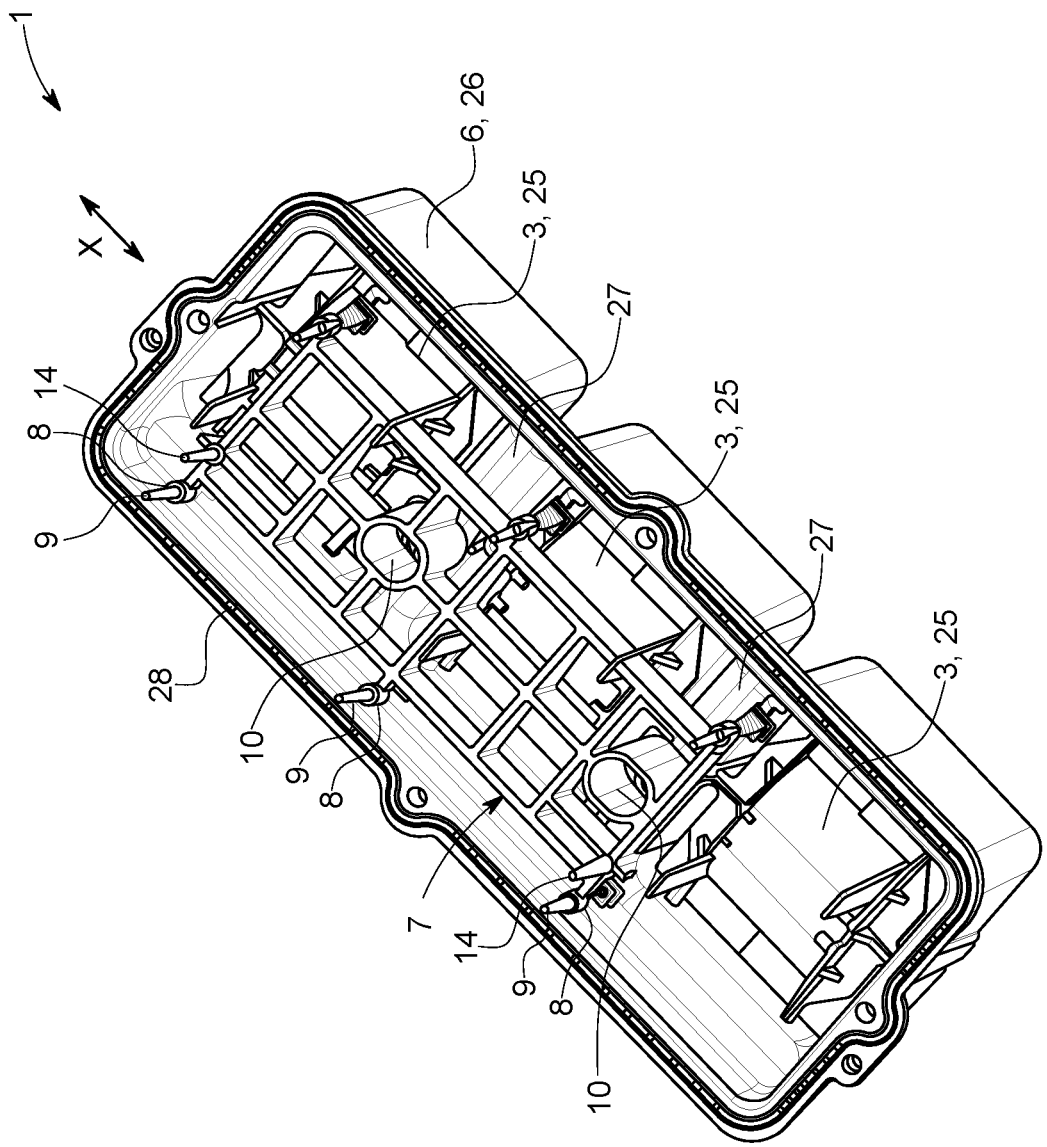
FIG. 3 shows a perspective view of a specially designed housing part with external electronic components arranged therein and a carrier according to the invention for supporting the connection of the external electronic components to a circuit board.
Figure 4:
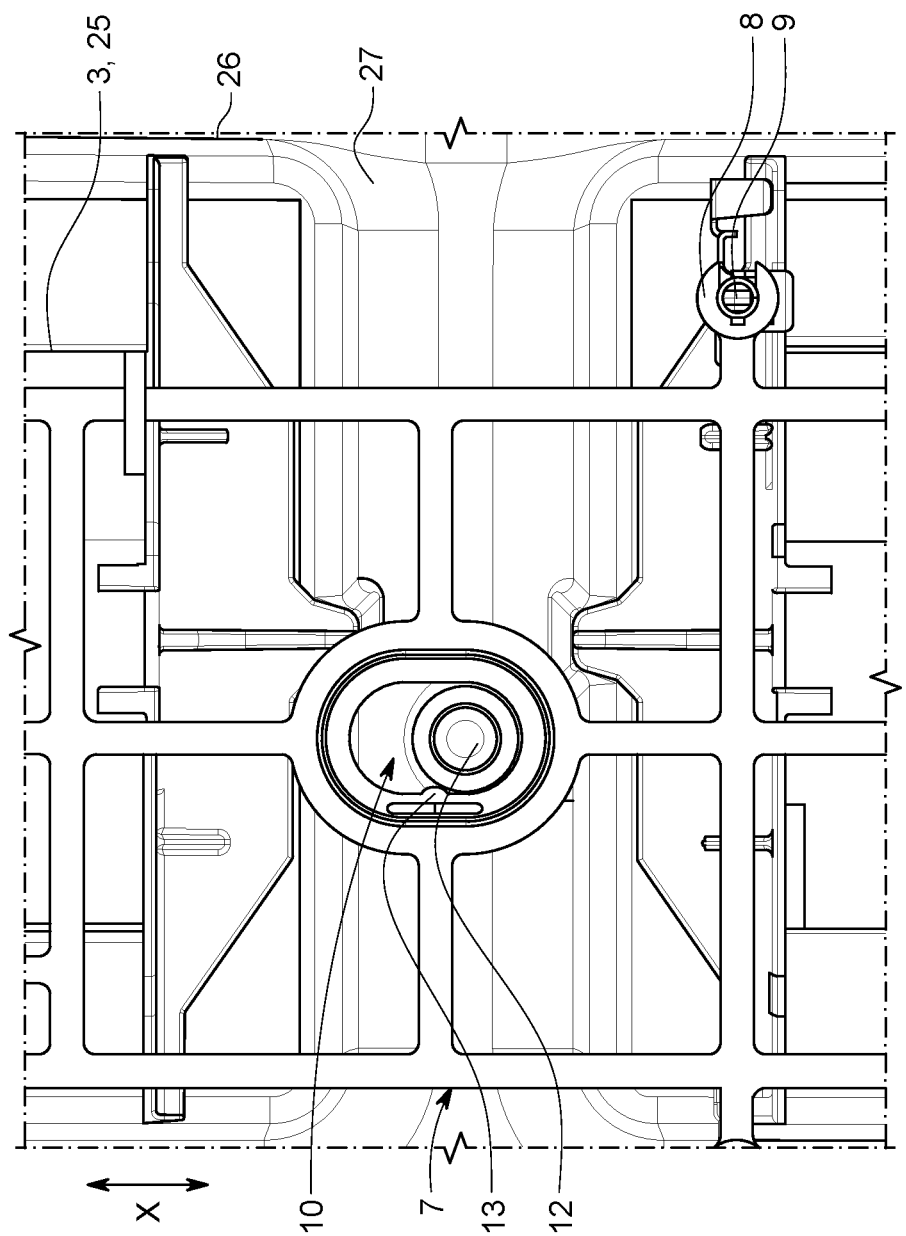
FIG. 4 shows a detailed view of the carrier of FIG. 3 from above.

FIG. 3 shows a perspective view of a specially designed housing part 6 of an electronic assembly 1 with external electronic components 3 arranged therein. FIG. 4 shows a detailed view of the carrier 7 of FIG. 3 from above. For example, the housing part 6 is a choke shell 26 in which chokes 25 are arranged as external electronic components 3. The choke shell 26 as the housing part 6 has spaces for the arrangement of the chokes 25, which are separated from one another by webs 27. The choke shell 26 is preferably made of metal, in particular of aluminium or an aluminium alloy, thereby ensuring cooling of the external electronic components 3. A seal 28 can be arranged at the edge of the choke shell 26. Above the chokes 25, the carrier 7 according to the invention is arranged to support the connection of the chokes 25 as external electronic components 3 with a circuit board 2 (not illustrated). The carrier 7 is mounted so as to be able to be moved on the choke shell 26. For this purpose, elongated holes 10 for receiving corresponding fastening screws 12 (see detail in FIG. 4) are arranged on the carrier 7, which fastening screws 12 can be screwed into threads provided for this purpose in the webs 27 of the choke shell 26. The elongated holes 10 allow the carrier 7 to be moved relative to the choke shell 26 in one direction, the longitudinal axis of the elongated hole 10, along the double arrow X. A latching lug 13 for determining a preferred position for the fastening element 11, in particular the fastening screw 12, can be arranged in the elongated hole 10 (see FIG. 4). When the carrier 7 is moved in the direction of the double arrow X, a small resistance must then be overcome by the latching lug 13.

The carrier 7 has holders 8 for receiving contact elements 9, which are connected to the connections 4 of the external electronic components 3. In addition, the contact elements 9 arranged in the holders 8 of the carrier 7 are used to establish the connection to corresponding contacts 5 on the circuit board 2 (not illustrated). In the exemplary embodiment illustrated, the contact elements 9 are formed by plugs 16, which can be connected to complementary sockets 17 on the circuit board 2 (not illustrated).

The carrier 7 is preferably made of plastic, for example of polyamide. On the one hand, this ensures easy manufacturability and, on the other hand, this achieves the necessary electrical insulation of the contact elements 9 arranged in the holders 8. If the carrier 7 is configured as a grid, material and thus weight can be saved, and access to the components arranged under the carrier, for example the external electronic components 3 or chokes 25, is made possible. At least one centring pin 14 can be arranged on the carrier 7, which can be arranged into a corresponding centring opening 15 on the circuit board 2 (see FIG. 6). The centring pin 14, like the elongated holes 10 and the holders 8 for the contact elements 9, can preferably be formed in a simple manner in a production process of the carrier 7, for example an injection moulding process.

Figure 5:
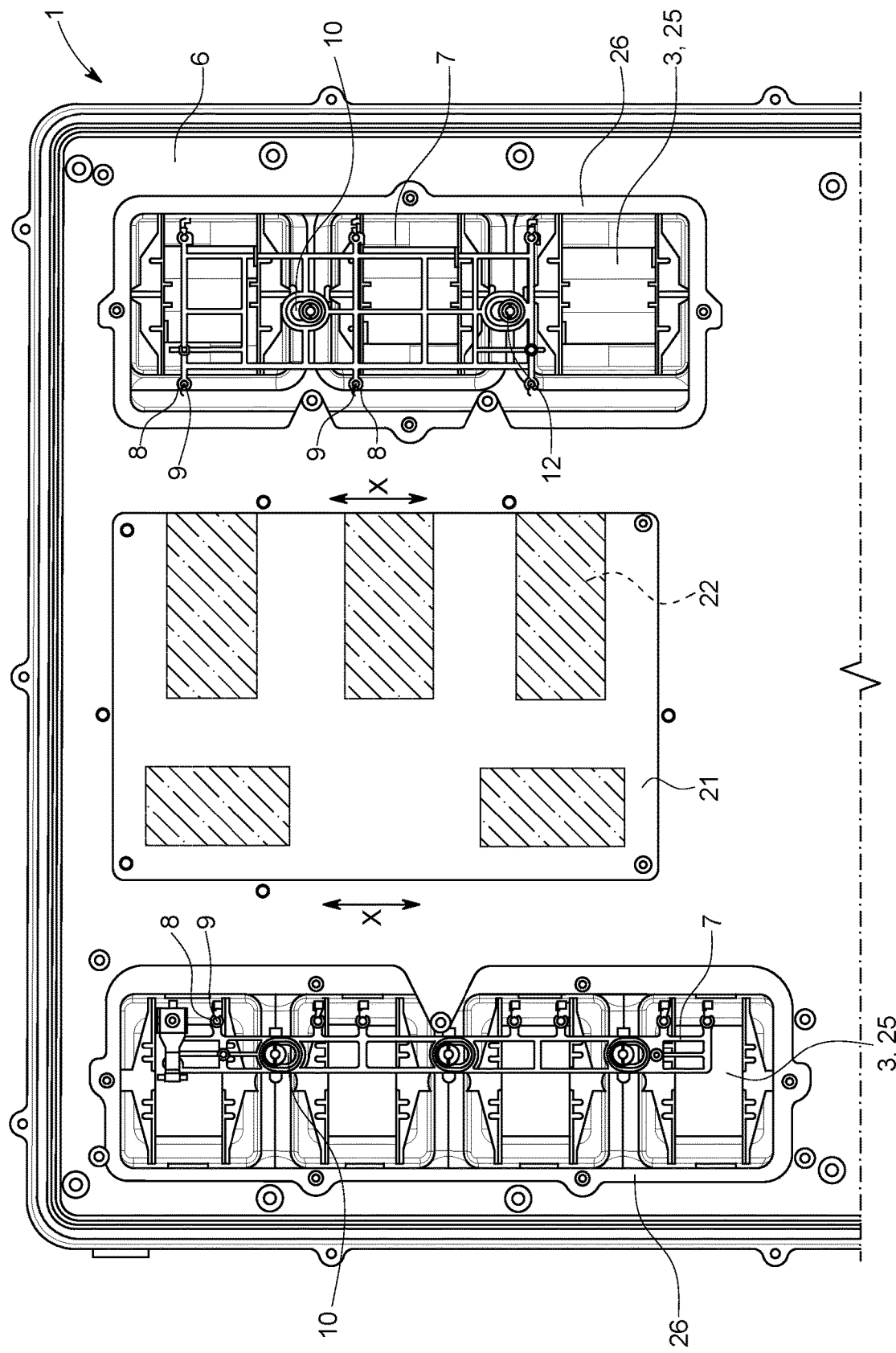
FIG. 5 shows a plan view of an electronic assembly with housing parts with external electronic components, corresponding carriers and a heat sink for cooling components, which are placed on the underside of a circuit board that can be arranged above.

FIG. 5 is a top view of an electronic assembly 1 comprising housing parts 6 with external electronic components 3, corresponding carriers 7 and a heat sink 21 for cooling components 22, which are placed on the underside of a circuit board 2 (see FIG. 6) that can be arranged above it. The electronic assembly 1 is, for example, the power unit of an inverter, in particular a photovoltaic inverter, which is used to convert the DC voltage generated by photovoltaic modules into an AC voltage. The housing or housing part 6 of the inverter contains two choke shells 26 for the DC-side power unit and the AC-side power unit of the inverter, in which the external electronic components 3 are arranged in the form of chokes 25. Four chokes 25 are arranged in the left DC-side power unit, while three chokes 25 are placed in the right AC-side power unit. According to the invention, carriers 7 are provided in each case, which are mounted so as to be able to be moved on the housing part 6 (double arrows X). The movable mounting is achieved by means of the elongated holes 10. The grid-like carriers 7 have holders 8 for receiving the contact elements 9 for connection to the connections 4 (not illustrated) of the external chokes 25. A heat sink 21 made of a suitable material is arranged between the choke shells 26 of the DC-side and AC-side power units of the inverter. This heat sink 21 is used for cooling electronic components 22 (indicated by dashed hatched areas) that are arranged on the underside of the circuit board 2, which is fastened over the choke shells 25 (see FIG. 6).

Figure 6:
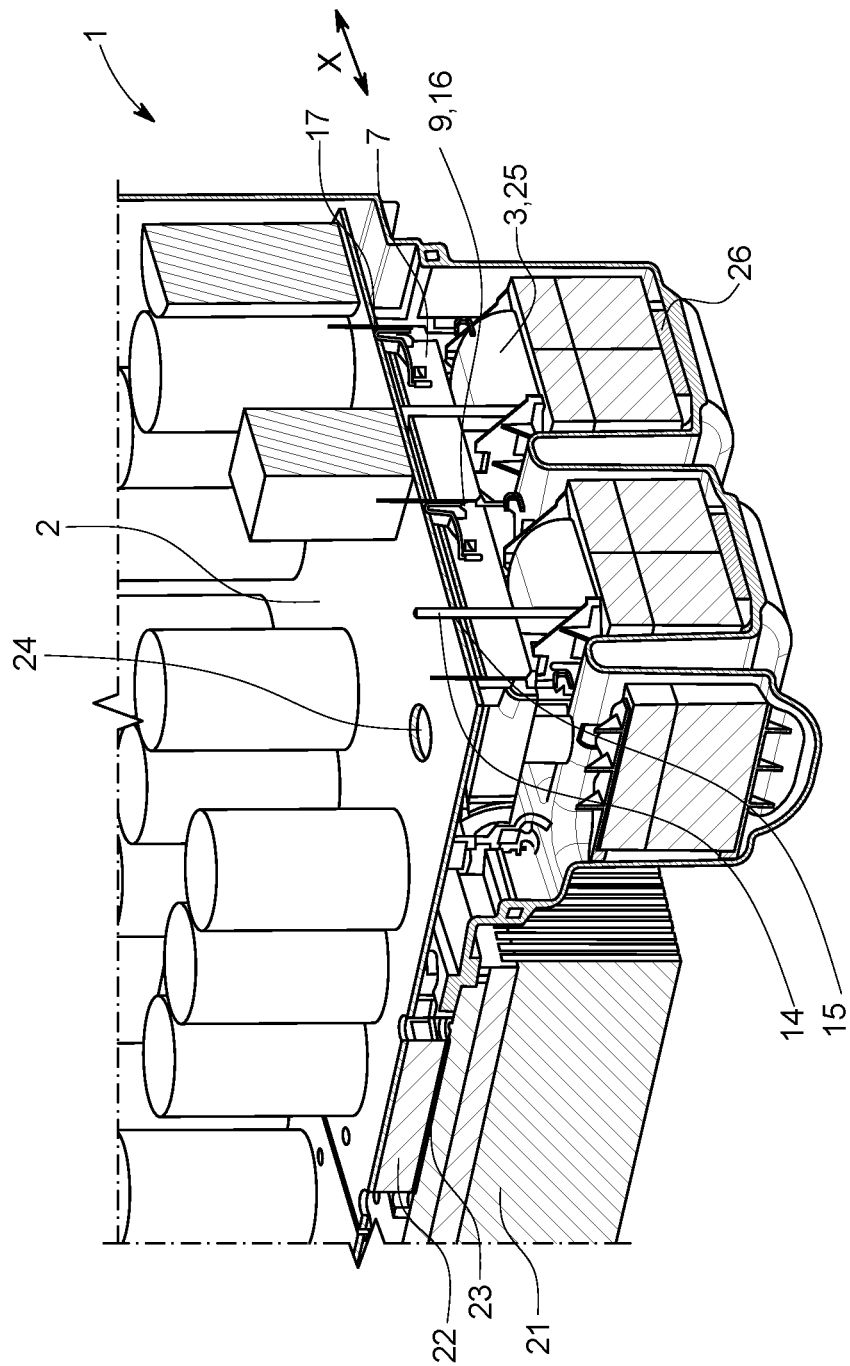
FIG. 6 shows a part of the electronic assembly according to FIG. 5 with a circuit board arranged above it.

FIG. 6 shows a part of the electronic assembly 1 according to FIG. 5 with a circuit board 2 arranged above it. By placing the circuit board 2 above the carrier 7 of the choke shell 25, contact is made with the contact elements 9. In the exemplary embodiment illustrated, the contact elements 9 are formed by plugs 16, which fit into corresponding sockets 17 on the circuit board 2 in order to achieve an electrical connection between the external chokes 26 and the conductor tracks on the circuit board 2.

To improve heat conduction, a heat-conducting paste 23 is preferably used between the components 22 and the heat sink 21. This heat-conducting paste 23, which may be formed by a phase change material, usually hardens, making it more difficult to disassemble the circuit board 2. Here, the movable mounting of the carrier 7 offers a further advantage in addition to compensating for tolerances. After loosening various fastening screws 12, with which the circuit board 2 and the carriers 7 are fixed to the housing part 6 (not illustrated), a release of the heat-conducting paste 23 between the components 22 and the heat sink 21 can be achieved by displacement in the direction of the double arrow X, and thus the circuit board 2 with the components 22 can be released from the heat sink 21. To support the movement, openings 24 can be arranged in the circuit board 2, into which corresponding tools, such as, for example, screwdrivers, can be inserted in order to move the circuit board 2.

Also visible are centring pins 14 on the carrier 7, which protrude into corresponding centring openings 15 on the circuit board 2.

The present invention facilitates the connection of the circuit board 2 to external electronic components 3 and thus simplifies the assembly and disassembly of components of the electronic assembly 1. Repair is substantially simplified, particularly in the case of inverters with assemblies designed in this way, and the costs can thus be reduced.

An application in other circuits, such as, for example, welding devices or battery chargers, is of course also possible and useful.

The invention claimed is:

1. An electronic assembly comprising at least one circuit board and external electronic components comprising electrical connections,
wherein the at least one circuit board has contacts for connection to the electrical connections of the external electronic components, and the at least one circuit board and the external electronic components are able to be attached to a housing part,
wherein a carrier which is mounted so as to be able to be moved is provided on the housing part,
wherein the carrier has holders for receiving contact elements for connection to the electrical connections of the external electronic components and for connection to the contacts on the at least one circuit board, and
wherein the carrier has at least one elongated hole for receiving a fastening element, which fastening element can be connected to the housing part.

2. The electronic assembly (1) according to claim 1, wherein the carrier is mounted so as to be able to be moved in one direction.

3. The electronic assembly according to claim 1, wherein a latching lug for determining a preferred position for the fastening element is arranged in the at least one elongated hole.

4. The electronic assembly according to claim 1, wherein the carrier is made of plastic.

5. The electronic assembly according to claim 1, wherein the carrier is configured as a grid.

6. The electronic assembly according to claim 1, wherein at least one centering pin is arranged on the carrier, which at least one centering pin can be arranged in a corresponding centering opening on the at least one circuit board.

7. The electronic assembly according to claim 1, wherein the contact elements are formed by plugs, which can be connected to a complementary sockets on the at least one circuit board.

8. The electronic assembly according to claim 1, wherein a heat sink is arranged on the housing part, which heat sink can be contacted with components arranged on the underside of the at least one circuit board.

9. The electronic assembly according to claim 8, wherein a heat-conducting paste can be arranged between the components and the heat sink.

10. The electronic assembly according to claim 1, wherein the circuit board has at least one opening.

11. The electronic assembly according to claim 1, wherein the external electronic components are formed by chokes.

12. The electronic assembly according to claim 11, wherein the chokes are arranged in choke shells.

13. An inverter with a power unit, wherein the power unit is configured as the electronic assembly according to claim 1.

14. The electronic assembly according to claim 1, wherein the fastening element comprises a fastening screw.

15. The inverter according to claim 13, wherein the inverter comprises a photovoltaic inverter.

* * * * *